(12) United States Patent
Smith

(10) Patent No.: US 7,411,455 B2
(45) Date of Patent: Aug. 12, 2008

(54) HIGH OUTPUT CURRENT BUFFER

(75) Inventor: Steven O. Smith, Brownfield, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 102 days.

(21) Appl. No.: 11/328,671

(22) Filed: Jan. 10, 2006

(65) Prior Publication Data

US 2007/0159255 A1    Jul. 12, 2007

(51) Int. Cl.
    *H03F 3/18* (2006.01)
    *H03F 3/26* (2006.01)
(52) U.S. Cl. ........................ 330/267; 330/264
(58) Field of Classification Search ........................ None
    See application file for complete search history.

(56) References Cited

U.S. PATENT DOCUMENTS

| | | | | |
|---|---|---|---|---|
| 4,573,021 A * | 2/1986 | Widlar | ........................ | 330/273 |
| 4,574,233 A | 3/1986 | Taylor | | |
| 5,216,291 A * | 6/1993 | Seevinck et al. | ............ | 327/535 |
| 5,278,516 A * | 1/1994 | Sakurai | ........................ | 330/267 |
| 6,429,744 B2 * | 8/2002 | Murray et al. | ............ | 330/267 |
| 6,501,334 B1 * | 12/2002 | Corsi et al. | ................ | 330/267 |
| 6,504,419 B1 * | 1/2003 | Damitio et al. | ............ | 327/413 |
| 6,535,064 B2 * | 3/2003 | Harvey | ........................ | 330/265 |
| 6,538,514 B2 * | 3/2003 | Harvey | ........................ | 330/265 |
| 6,586,997 B1 * | 7/2003 | D'Aquino et al. | ........... | 330/257 |
| 6,762,646 B1 * | 7/2004 | Bell | ........................ | 330/257 |

* cited by examiner

*Primary Examiner*—Robert J. Pascal
*Assistant Examiner*—Krista M Flanagan
(74) *Attorney, Agent, or Firm*—Cesari and McKenna, LLP; Edwin H. Paul, Esq.

(57) ABSTRACT

A bipolar high output current buffer is disclosed using a negative feedback current mirror to supply the base drive to an output transistor. Small quiescent currents are used wherein the buffer demonstrates low quiescent power dissipation. The current mirror supplies the incremental base drive to the output transistor to support high output currents. When the output drive may source or sink the high output currents, two current mirrors may be used, one for each of the source and the sinking circuitry. This invention provides for minimal loss of dynamic range.

13 Claims, 4 Drawing Sheets

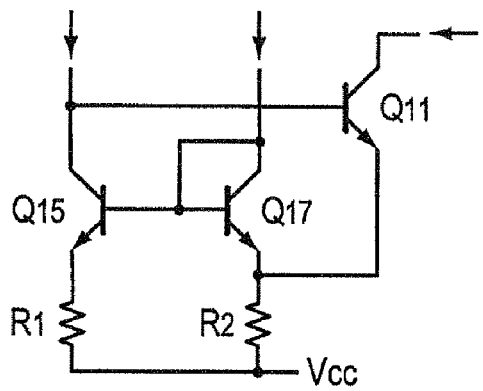
FIG. 3 EARLIER ART
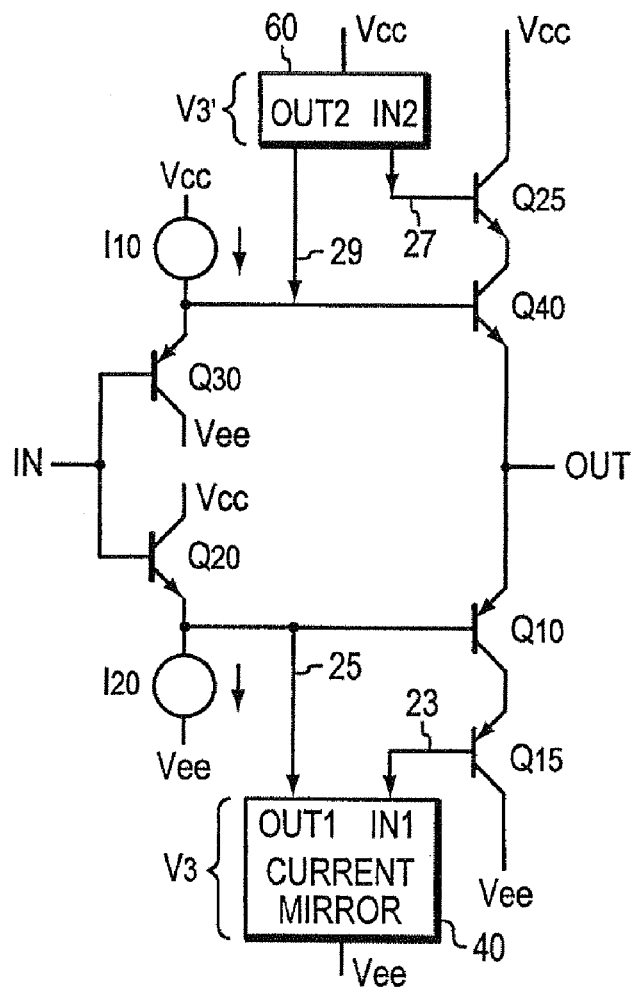
FIG. 4

HIGH OUTPUT CURRENT BUFFER

BACKGROUND OF THE INVENTION

1. Field of the Invention

The present invention relates to bipolar high output current buffers, and more particularly to buffers with stacked input and output transistors.

2. Background Information

Prior art bipolar high current buffers typically comprise four transistors, a PNP and NPN input and a corresponding NPN and PNP output arranged in a push pull or the other stacked configuration. In this configuration, the output is limited by the output transistor beta (current gain) and the base drive available from the input stage. This leads to higher than desired quiescent power dissipation, due to high current in the input stage. FIG. 1 shows such a buffer, where an input signal (IN) is applied to the bases of Q2 and Q3, and the output(OUT) is taken from the emitters of Q1 and Q4. Notice that the current available to the base of Q1 is at most I2, and the current available to the base of Q4 is at most I1. Notice also, that the output voltage swing can come within one base emitter drop of Vcc, when high, and one base emitter drop of Vee, when low.

One prior art approach to reduce the quiescent power dissipation is to use another set of transistors to in effect increase the current gain by ananging an emitter of another transistor to drive the base of the output transistor. However, such a circuit will reduce the dynamic swing of the output by at least one additional base emitter drop near the Vee rail and another near the Vcc rail. FIG. 2 illustrates this approach. Notice that Q5's base drive is sourced from the emitter of Q7. The range, in this circuit, of available output current via Q5 is the current source I3 multiplied by the beta of Q7 times the beta of Q5. So, large output currents are available even with a small I3 current. Since I3 is small, the quiescent power dissipation in the circuit is much smaller than that of FIG. 1. However, notice that if Q7 is fully on, Vee plus a Vbe (base emitter drop) appears at Q7's emitter and so at the base of Q5, and that the OUT is necessarily higher than Vee by the two Vbe base emitter drops (Q5 and Q7). The same is true at the Vcc end of the dynamic range where I4 drives the base of Q8, and, where the OUT is at least the base emitter drops of Q6 and Q8 below Vcc. This limits the dynamic swing of the circuit in FIG. 2 to at least four Vbe's less than Vcc to Vee.

U.S. Pat. No. 4,574,233 to Taylor (Taylor) describes a high impedance current source using negative feed back to produce a high impedance current source that operates with small voltages (tens/hundreds of millivolts) across the current source. The circuit is shown in FIG. 3. The output current is the collector current of Q11 and any change is sensed across the resistor R2. The sensed voltage across R2 appears across R1 via the common base connections of Q15 and Q17. The current through the collector of Q15 changes and that in turn changes the base current to Q11 in such way to reduce the original change (that is negative feedback). The circuit of FIG. 3 provides a high output impedance current source output that operates close to the Vee rail. Taylor also teaches that the ratio of R2 to R1 can fix the loop gain of the feed back loop and is selected to produce a relatively high incremental output impedance, see column 2, line 50.

Taylor in column 2, lines 31-36, describes how his high output impedance current source circuit of FIG. 3 can be operated as an amplifier. The input is a voltage at the collector of Q15 and the output is taken from the collector of Q11. The present invention makes use of a circuit similar to that shown in FIG. 3, but with some differences. Those differences are not shown, anticipated, taught or suggested by Taylor.

SUMMARY OF THE INVENTION

The limitations of the prior art are overcome and other advantages are provided by the present invention. Accordingly, the present invention provides a first bipolar transistor with its emitter producing the high output current. A second bipolar transistor, of the same polarity as the first, has its emitter coupled to the collector of the first transistor, and its collector coupled to a first voltage source. The base of the first transistor is coupled to the collector of a third transistor of the opposite polarity with respect to the first and second transistors. The emitter of the third transistor is coupled to a first resistor whose distal end is coupled to the first voltage source. The emitter of the third transistor is also coupled to the emitter of a fourth transistor of common polarity with the third transistor. Please note that the first resistor distal end may be connected to a second voltage source that may have a greater magnitude than the first voltage source.

Note that the term "coupled" is defined to mean "connected" or "functionally connected." "Functionally" here refers to benign components that may be between the items "coupled." The terms "connected" and "coupled" are used herein synonymously.

The collector of the fourth transistor is coupled to its base and to a first current source, and the base of the second transistor coupled to a resistor whose distal end is coupled to the second voltage source. The base of the second transistor is also coupled to the emitter of a fifth transistor of common polarity to the third and fourth transistors, and the collector of the fifth transistor is coupled to a second current source.

The bases of the fourth and the fifth transistors are coupled together to form a current mirror, and the base of the third transistor is coupled to the collector of the fifth transistor. The third, fourth and fifth transistors form a negative feedback loop. An incremental base drive for the first transistor to support an incremental current at the emitter of the first transistor is supplied from the collector of the third transistor.

In one preferred embodiment, the polarity of the first and second transistors are PNP, and the polarity of the third, fourth, and fifth transistors are NPN. In another embodiment, the first and second transistors are NPN, the third, fourth, and fifth transistors are PNP.

In another embodiment example, there is a sixth transistor of common polarity with the third, fourth and fifth transistors. The emitter of the sixth transistor is coupled to the base of the first transistor, its emitter is also coupled to a third current source, and the base of the sixth transistor is suitable to receive an input signal.

In another embodiment, an first NPN and a first PNP have emitters connected together forming a high current output. Another pair of a second PNP and a second NPN have base connected together forming an input. The emitters of the second pair are both connected to current sources arranged consistently with the normal current flow through each transistor type. The collectors of the second pair are coupled to power supplies of proper polarities. The emitter of the second PNP is connected to the base of the first NPN and the emitter of the second NPN is connected to the base of the first PNP. This circuit forms a basic high current buffer circuit.

A third NPN has its collector coupled to a positive power supply and its emitter coupled to the collector to the first NPN. A third PNP has its collector coupled to a negative (with respect to the positive power supply) power supply and its emitter coupled to the collector of the first PNP.

A first current mirror with a first input and a first output is arranged with both input and output arranged to sink current signals. The first input is coupled to the base of the third PNP, and the first output is coupled to the base of the first PNP. The first current mirror is arranged to work near the negative power supply. In this configuration, a change in the output signal current through the first and the third PNP's is reflected back to the first current mirror that supplies the necessary base drive to the first PNP transistor to accommodate the change in the output signal current delivered.

A second current mirror with a first input and a first output is arranged with both input and output arranged to source current signals. The first input is coupled to the base of the third NPN, and the first output is coupled to the base of the first NPN. The second current mirror is arranged to work near the positive power supply. In this configuration, a change in the output signal current through the first and the third NPN's is reflected back to the second current mirror that supplies the necessary base drive to the first NPN transistor to accommodate the change in the output signal current delivered.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 3 is a schematic of a prior art circuit that operates close to the power rails and still maintains a high output impedance;

FIG. 4 is a schematic of a circuit incorporating a form of the present invention;

DETAILED DESCRIPTION OF AN ILLUSTRATIVE EMBODIMENT

Figure 1:
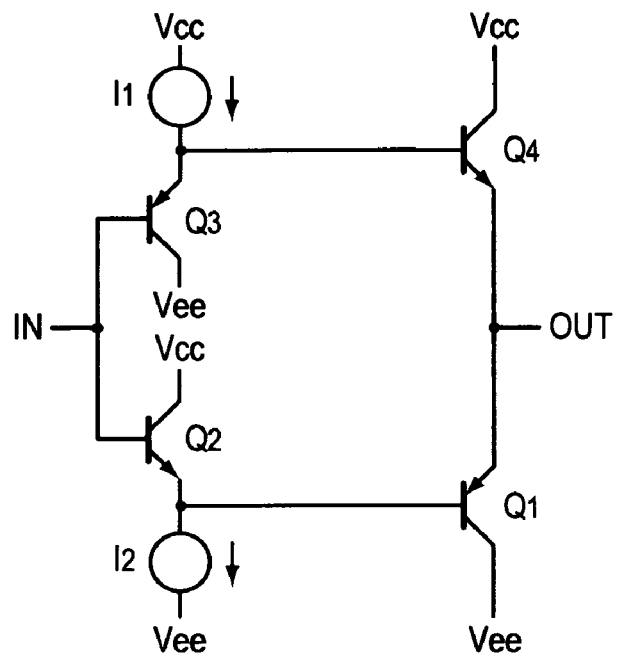
FIG. 1 is a prior art schematic of a high output current buffer.
Figure 2:
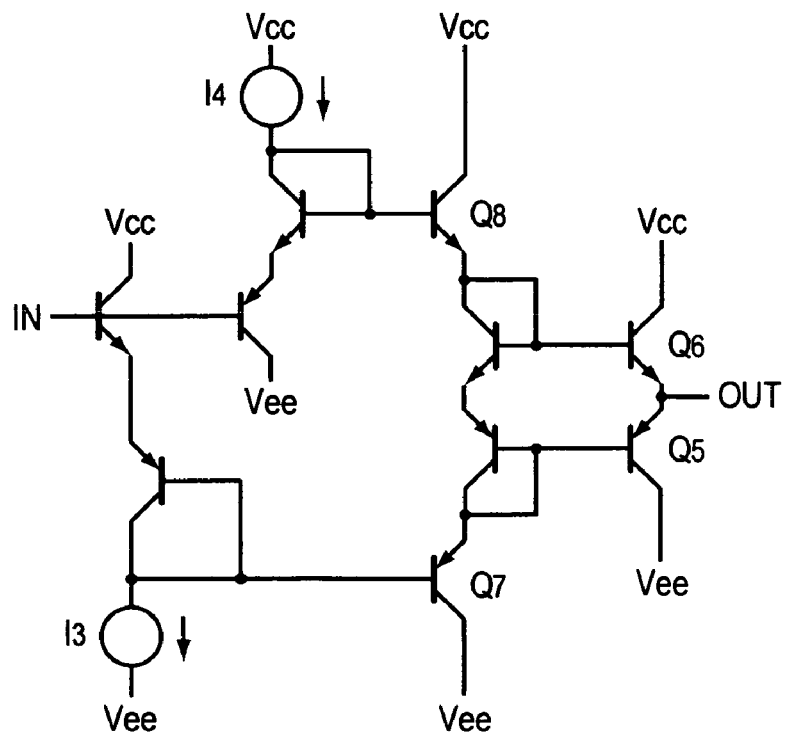
FIG. 2 is another prior art high output current buffer.

FIG. 4 is a functional block diagram/circuit schematic illustrating the present invention. The present invention provides a current minor approach that augments the four transistor buffer of FIG. 1. In this way, the quiescent current and power are held low, while the current output is high and the output voltage dynamic range is relatively unrestricted. Compare to FIG. 1. The four transistor buffers, now labeled Q10, Q20, Q30, and Q40, remain, but feedback current mirrors 40 and 60 and transistors Q15 and Q25 have been added. The current mirrors operate in a preferred embodiment to substantially reduce quiescent power while maintaining the dynamic range of the inventive circuit to about that of the circuit of FIG. 1. As mentioned above, the prior art approaches, as in FIG. 2, will reduce the OUT voltage dynamic range by at least two additional Vbe voltage drops.

As discussed below, in FIG. 4 when the OUT signal is at its extreme near Vee, Q10 will be at or near saturation (Vce sat) and drop, in a preferred embodiment, about 40-50 mV. The collector of Q10 will be at least the Vbe of Q15 from Vee, to the OUT is one Vbe (Q15) and one Vce (sat)(Q10) higher than Vee. Similarly, at the high extreme OUT will be one Vbe (Q25) and one Vce (sat) (Q40) lower than Vcc. The design of the current mirrors 40 and 60 provides for V3 and V3' to be about 60-80 mV, see below. In this embodiment the circuit of FIG. 4 will demonstrate a dynamic range that is only about 100 mV less than that of FIG. 1. This is a substantial improvement over the prior art's reduction of 1.6V. For example, if the Vcc to Vee range was 3.3V, the rail to rail dynamic range, using the prior art circuit of FIG. 2, would be the 3.3V minus two base emitter drops, or about 1.6V at each rail. In such a case, the full dynamic range of the prior art circuit is near zero, while using the present invention the available dynamic range would be about 1.6V.

Figure 5:
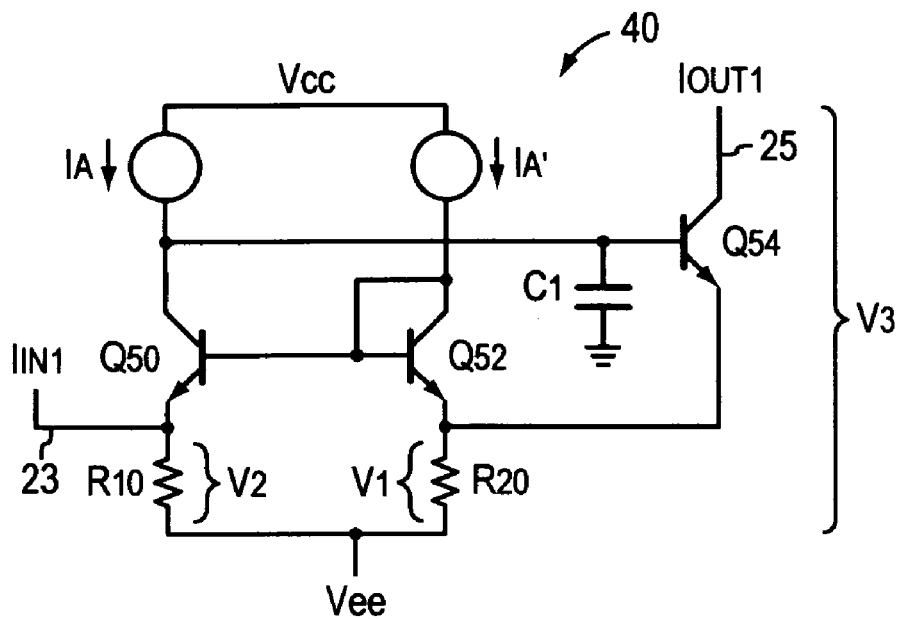
FIGS. 5 and 6 are schematic details of the current mirrors of FIG. 4.

FIG. 5 is a schematic of the mirror 40 of FIG. 4. Note that the circuit is similar to Taylor's, however with important differences. First, the input to the circuit is IN1 which is input to R10. This connection is not taught, suggested or contemplated by Taylor, and there is a compensation capacitor C1, also missing from Taylor, at the base of the output transistor Q54 to provide a one pole roll off of loop gain for circuit stability. In FIG. 5 the currents through Q50 and Q52 mirror each other.

In FIG. 5 one preferred embodiment might have Iout1 equal to 1 ma, IA' equal to 1 ma, and IA equal to 2 ma. If R10 and R20 are each 20 ohms, the quiescent voltage drops V1 and V2 would each be 40 mV. The feed back operation, around the loop of Q50, Q54, to Q52, forces V1 to equal V2. For example, if a higher current (say due to an increased load) at OUT (FIG. 4) is sinked by Q10 and Q15 of FIG. 4, Iin1 item 23 into the resistor R10 increases. The current through Q50 of FIG. 5 is reduced, and more of IA is available to drive the base of Q54. This increases the collector current of Q54, Iout1 item 25, to supply more base drive to Q10 (FIG. 4) to support the increased OUT current. V1 rises to balance V2 via the negative feedback and a stable operating condition is achieved.

In this embodiment, V1 is about 40 mV, and Q54 may operate to near saturation so that V3 may be about 60 to 80 mV.

Still referring to FIG. 4, The quiescent current I20 (as well as I10) is now quite small since it is not an exclusive source of the base drive to Q10 (as for Q1 of FIG. 1), so the quiescent power dissipation is small. The feedback current mirror 40, as in FIG. 5, now will supply the base drive to Q10 and is actively adjusted, by the feedback circuit, to supply the base drive current for Q10 necessary to support the output current.

Figure 6:
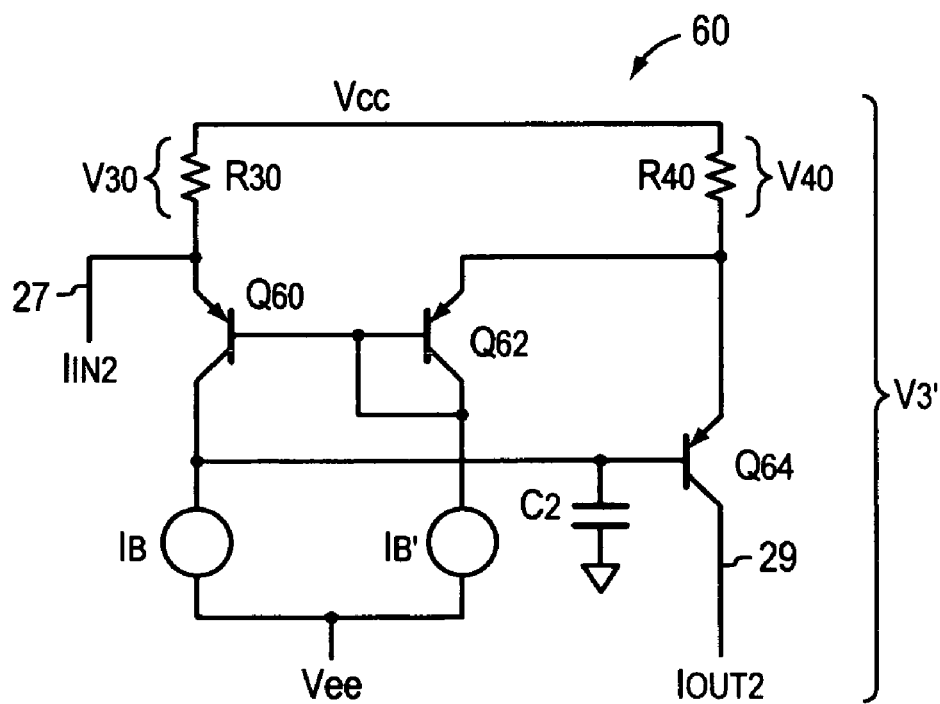

The circuit of FIG. 5 illustrates the use of the current mirror at the Vee end of the dynamic output range of the circuit of FIG. 4. A corresponding current mirror 60 is illustrated in FIG. 6 for the operation at the Vcc end of the dynamic range. Operation is directly analogous to that described for FIG. 5, and voltage drops across Q25 and Q40 will be about one Vbe drop plus one Vce drop.

In FIG. 6, Iout2 might also be set to 1 ma, IB' to 1 ma, and IB to 2 ma. If R30 and R40 are each 20 ohms, the quiescent voltage drops V30 and V40 would both be about 40mV. The feed back operation forces V40 to equal V30, for example, if a higher current (say due to an increased load at the OUT) at OUT is sourced by Q40 and Q25 of FIG. 4, Iin2 item 27 is increased. Q60 and 062 form a current mirror, and, when Iin2 increases the current through Q60 of FIG. 6 is reduced, and more of IB is available to drive the base of Q64. This increases the collector current of Q64, the Iout2 item 29, to supply more base drive to Q40 (FIG. 4) to support the increased OUT current. V40 rises to balance V30 via the negative feedback and a stable operating condition is achieved. C2 provides a one pole roll off that enhances stability.

Figure 7:
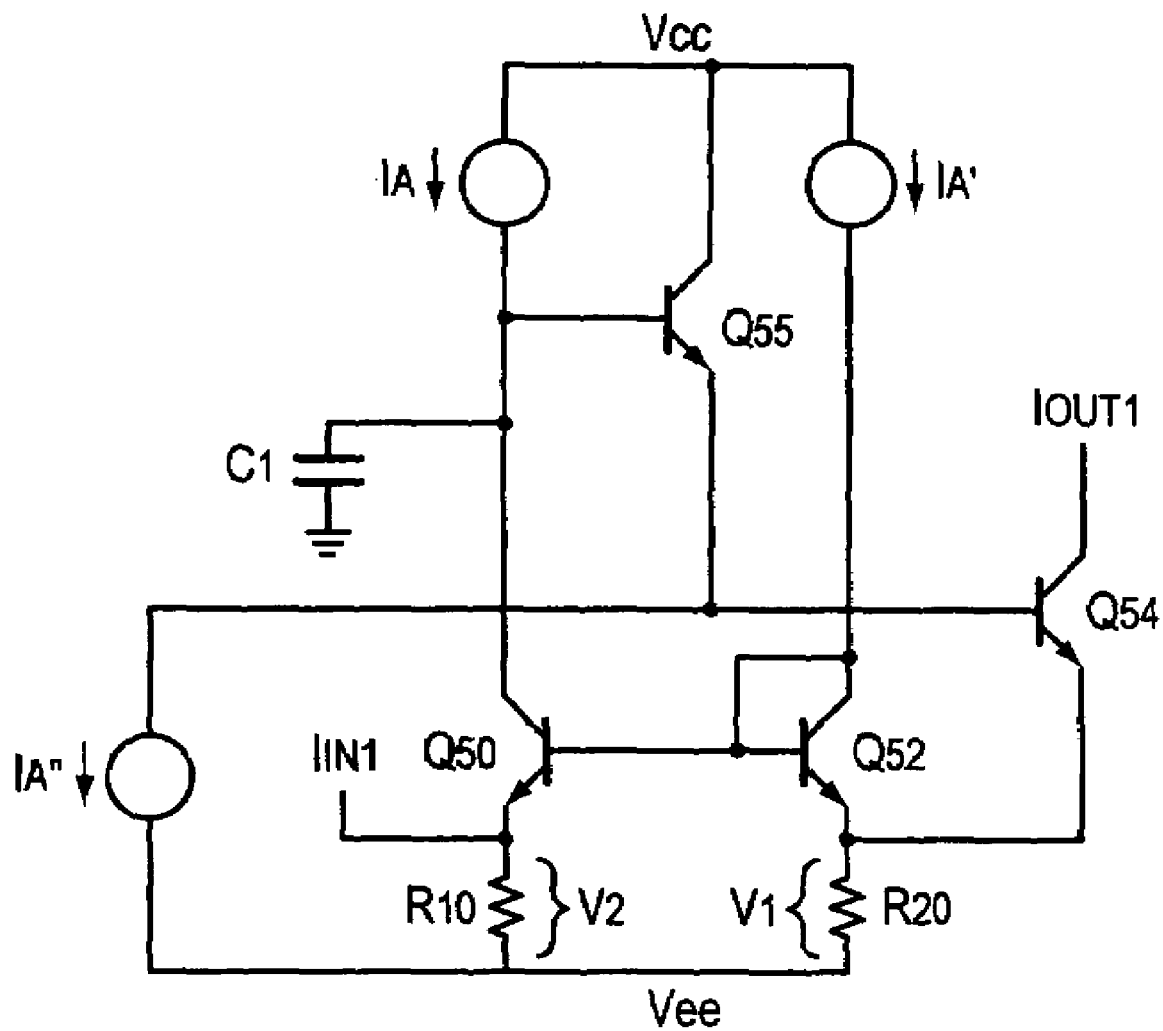
FIG. 7 is a schematic of FIG. 5 with an added emitter follower buffer.

In some preferred embodiments an additional emitter follower or comparable buffer may be added to the circuits of FIGS. 5 and 6. FIG. 7 shows the added NPN emitter follower Q55 and current source IA" as it would be added to the circuit of FIG. 5. A corresponding buffer or emitter follower may be added to the circuit of FIG. 6 for the current mirror 40 of FIG. 4. Q55 buffers the base of Q54 from the current source IA, wherein any change in the amount of current source IA (due to a change of Iout1 current) diverted to or from the base of Q54 is reduced by the beta of Q55. In a preferred embodiment, this improves signal distortion within the circuits.

In these circuits described above, care must be taken that the transistors involved stay out of saturation, as will be known to those skilled in the art.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A high current output buffer comprising:
    a first bipolar transistor with its emitter producing the high output current;
    a second bipolar transistor having the same polarity as the first, the emitter of the second transistor connected to the collector of the first transistor, and the collector of the second transistor connected to a first voltage source;
    the base of the first transistor coupled to the collector of a third transistor of the opposite polarity with respect to the first and second transistors;
    the emitter of the third transistor connected to a first resistor whose distal end is coupled to the first voltage source;
    the emitter of the third transistor also coupled to the emitter of a fourth transistor of common polarity with the third transistor;
    the collector of the fourth transistor coupled to its base and to a first current source;
    the base of the second transistor coupled to a resistor whose distal end is coupled to the first voltage source;
    the base of the second transistor also coupled to the emitter of a fifth transistor of common polarity to the third and fourth transistors;
    the collector of the fifth transistor coupled to a second current source;
    the bases of the fourth and the fifth transistors are coupled together; and
    the base of the third transistor coupled to the collector of the fifth transistor, wherein the fourth and fifth transistors form a current mirror, and wherein the third, fourth and fifth transistors form a negative feedback loop, and where any incremental base drive for the first transistor to support an incremental current at the emitter of the first transistor is supplied from the collector of the third transistor.

2. The high output current buffer of claim 1 wherein the polarity of the first and second transistors are PNP, the polarity of the third, fourth, and fifth transistors are NPN, and further comprising a capacitor coupled between the base of the third transistor and a return path.

3. The high output current buffer of claim 1 wherein the polarity of the first and second transistors are NPN, the polarity of the third, fourth, and fifth transistors are PNP.

4. The high output current buffer of claim 1 further comprising:
    a sixth transistor of common polarity with the third, fourth and fifth transistors, the emitter of the sixth transistor coupled to the base of the first transistor, its emitter also coupled to a third current source, and the base of the sixth transistor coupled to an input signal.

5. A high current output buffer comprising:
    a first PNP with its emitter coupled to a first current source, the current source coupled to a positive voltage source, Vcc;
    a first NPN with its emitter coupled to a second current source, the second current source coupled to a voltage source less positive than Vcc, this less positive voltage source labeled Vee;
    wherein the collector of the first PNP is coupled to Vee, and the collector of the first NPN is coupled to Vcc, and wherein the bases of these transistors are coupled together and are arranged to accept an input signal; the emitter of the first PNP is coupled to the base of a second NPN and the emitter of the first NPN is coupled to the base of a second PNP, the emitters of the second PNP and the second NPN coupled together to provide an output signal;
    a third NPN with its collector coupled to Vcc and emitter coupled to the collector of the second NPN;
    a third PNP with its collector coupled to Vee and its emitter coupled to the collector of the second PNP;
    a first current mirror with a first input and a first output, each arranged to sink current signals, wherein the first input is coupled to the base of the third PNP and the first output is coupled to the base of the second PNP; the first current mirror arranged to work near Vee; and
    wherein a change in the output signal current is reflected back to the first current mirror that supplies the necessary base drive to the second and third PNP transistors to accommodate the change in the output signal current delivered.

6. The circuit of claim 5 further comprising a second current minor with a second input and a second output, each arranged to source current signals, wherein the second input is coupled to the base of the third NPN and the second output is coupled to the base of the second NPN, and wherein the second current mirrors are arranged to operate near Vcc, and wherein a change in the output signal current is reflected back to the second current mirror that supplies the necessary base drive to the second and third PNP transistors to accommodate the change in the output signal current delivered.

7. The circuit of claim 6 wherein the second current mirror comprises:
    a fourth PNP with its collector arranged as the second output;
    a first resistor coupled from the emitter of the fourth PNP to Vcc;
    a fifth PNP with its base connected to the base of a sixth PNP, and the collector of the fifth and the sixth PNP's each coupled to current sources coupled to Vee, the fifth and sixth PNP's forming a current mirror;
    the emitter of the sixth PNP coupled to a resistor to Vcc, wherein the emitter of the sixth PNP is arranged as the second input;
    the collector of the sixth PNP connected to the base of the fourth PNP;
    the base of the fifth PNP coupled to its collector forming a diode connected transistor, and the emitter of the fifth PNP coupled to the emitter of the fourth PNP; and
    a capacitor coupled from the collector of the sixth PNP to a low impedance return path.

8. The circuit of claim 7 further comprising a buffer located between the collector of the sixth PNP transistor and the base of the fourth PNP.

9. The circuit of claim 5 wherein the first current mirror comprises:
- a fourth NPN with its collector arranged as the first output;
- a first resistor connected from the emitter of the fourth NPN to Vee;
- a fifth NPN with its base coupled to the base of a sixth NPN, and the collector of the fifth and the sixth NPN's each coupled to current sources connected to Vcc, the fifth and sixth NPN's forming a current mirror;
- the emitter of the sixth NPN coupled to a resistor to Vee, wherein the emitter of the sixth NPN is arranged as the first input;
- the collector of the sixth NPN coupled to the base of the fourth NPN;
- the base of the fifth NPN coupled to its collector forming a diode coupled transistor, and the emitter of the fifth NPN coupled to the emitter of the fourth NPN, and
- a capacitor coupled from to the collector of the sixth NPN to a low impedance return path.

10. The circuit of claim 9 further comprising a buffer located between the collector of the sixth NPN transistor and the base of the fourth NPN.

11. A high current output buffer comprising:
- a first bipolar transistor with its emitter producing the high output current;
- a second bipolar transistor having the same polarity as the first, the emitter of the second transistor connected to the collector of the first transistor, and the collector of the second transistor connected to a first voltage source;
- the base of the first transistor coupled to the collector of a third transistor of the opposite polarity with respect to the first and second transistors;
- the emitter of the third transistor connected to the emitter of a fourth transistor of common polarity with the third transistor;
- the base of the second transistor also coupled to the emitter of a fifth transistor of common polarity to the third and fourth transistors; wherein the fourth and the fifth transistors formal current mirror, and
- wherein the third, fourth and fifth transistors form a negative feedback loop, and where any incremental base drive for the first transistor to support an incremental current at the emitter of the first transistor is reflected back via the negative feedback loop and supplied from the collector of the third transistor.

12. The high current output buffer of claim 11 wherein the polarity of the first and second transistors are PNP, the polarity of the third fourth and fifth transistors are NPN.

13. The high current output buffer of claim 11 wherein the polarity of the first and second transistors are NPN, the polarity of the third fourth and fifth transistors are PNP.

* * * * *